United States Patent
Searls et al.

(10) Patent No.: US 6,906,921 B2
(45) Date of Patent: Jun. 14, 2005

(54) CHANNELED HEAT DISSIPATION DEVICE AND A METHOD OF FABRICATION

(75) Inventors: Damion Searls, Hillsboro, OR (US); Tom Pearson, Beaverton, OR (US); James Jackson, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/756,703

(22) Filed: Jan. 12, 2004

(65) Prior Publication Data

US 2004/0179336 A1 Sep. 16, 2004

Related U.S. Application Data

(63) Continuation of application No. 10/387,654, filed on Mar. 12, 2003, now Pat. No. 6,747,873.

(51) Int. Cl.⁷ ............................................. H05K 7/20
(52) U.S. Cl. ............ 361/695; 361/690; 361/694; 257/721; 257/722; 174/16.1; 174/16.3; 165/80.3; 165/122
(58) Field of Search ......................... 361/689–697; 257/706, 722, 727; 174/16.1, 16.3; 165/80.3, 104.33, 122

(56) References Cited

U.S. PATENT DOCUMENTS

| 5,377,745 | A  | * | 1/1995  | Hsieh ................... 165/80.3 |
| 5,704,419 | A  |   | 1/1998  | Agonafer et al. |
| 5,740,014 | A  |   | 4/1998  | Lin |
| 6,023,413 | A  |   | 2/2000  | Umezawa |
| 6,067,228 | A  |   | 5/2000  | Li |
| 6,172,872 | B1 |   | 1/2001  | Katsui |
| 6,301,110 | B1 |   | 10/2001 | Kodaira |
| 6,348,748 | B1 |   | 2/2002  | Yamamoto |
| 6,575,231 | B1 |   | 6/2003  | Wu |
| 6,671,172 | B2 | * | 12/2003 | Carter et al. ............ 361/697 |
| 6,678,158 | B2 | * | 1/2004  | Li et al. ................. 361/697 |
| 6,691,769 | B2 | * | 2/2004  | Johnson et al. ........ 165/80.3 |

OTHER PUBLICATIONS

U.S. Appl. No. 10/387,654, filed Mar. 12, 2003, Searls et al.

* cited by examiner

Primary Examiner—Boris Chervinsky
(74) Attorney, Agent, or Firm—Libby H. Hope

(57) ABSTRACT

Numerous embodiments of a channeled heat dissipation device and a method of fabrication are disclosed. In one embodiment, a channeled heat dissipation device comprises a base portion having a dissipation surface and a substantially opposed mounting surface, and at least one channel defined in the base portion, wherein said at least one channel extends from said dissipation surface to said mounting surface.

5 Claims, 6 Drawing Sheets

CHANNELED HEAT DISSIPATION DEVICE AND A METHOD OF FABRICATION

This application is a continuation application of application Ser. No. 10/387,654, entitled "A Channeled Heat Dissipation Device and a Method of Fabrication", filed Mar. 12, 2003 now U.S. Pat. No. 6,747,873.

BACKGROUND

Higher performance, lower cost, increased miniaturization of integrated circuit components, and greater packaging density of integrated circuits are ongoing goals of the computer industry. As these goals are achieved, microelectronic dice become smaller. Accordingly, the density of power consumption of the integrated circuit components in the microelectronic die has increased, which, in turn, increases the power requirements of other board level components that may be associated with the microelectronic die, such as voltage regulators, which may perform power delivery, for example. If the temperature of these associated components becomes too high, the components may be damaged or destroyed.

Various apparatus and techniques have been used and are presently being used for removing heat from microelectronic dice. One such heat dissipation technique involves the attachment of a high surface area heat sink to a microelectronic die. FIG. 6 illustrates an assembly 200 comprising a microelectronic die 202 (illustrated as a flip chip) physically and electrically attached to a substrate carrier 204 by a plurality of solder balls 206. A heat sink 208 is attached to a back surface 212 of the microelectronic die 202 by a thermally conductive adhesive 214. The heat sink 208 is usually constructed from a thermally conductive material, such as copper, copper alloys, aluminum, aluminum alloys, or any suitable combination thereof. The heat generated by the microelectronic die 202 is drawn into the heat sink 208 (following the path of least thermal resistance) by conductive heat transfer.

High surface area heat sinks 208 are generally used because the rate at which heat is dissipated from a heat sink is substantially proportional to the surface area of the heat sink. The high surface area heat sink 208 usually includes a plurality of projections 216 extending substantially perpendicularly from the microelectronic die 202. It is, of course, understood that the projections 216 may include, but are not limited to, elongate planar fin-like structures and columnar/pillar structures. The high surface area of the projections 216 allows heat to be convectively dissipated from the projections 216 into the air surrounding the high surface area heat sink 208. A fan 218 may be incorporated into the assembly 200 to enhance the convective heat dissipation. However, although high surface area heat sinks are utilized in a variety of microelectronic applications, they may not provide heat dissipation for associated components that may be attached to the substrate carrier 204 (not shown). Additionally, heat sinks such as this may reduce or block airflow to components on a substrate, thereby causing areas of air stagnation, which may result in inadequate heat dissipation for one or more of these components.

Therefore, it would be advantageous to develop apparatus and techniques to effectively remove heat from a microelectronic die while providing some capability for heat dissipation for other components associated with the die.

BRIEF DESCRIPTION OF THE DRAWINGS

The subject matter regarded as embodiments of the claimed subject matter is particularly pointed out and distinctly claimed in the concluding portion of the specification. Embodiments of the claimed subject matter, however, both as to organization and method of operation, together with objects, features, and advantages thereof, may best be understood by reference to the following detailed description when read with the accompanying drawings in which:

DETAILED DESCRIPTION

Embodiments of the claimed subject matter may comprise a channeled heat dissipation device and a method of fabrication. One particular embodiment of the claimed subject matter may comprise a heat dissipation device having a base portion, wherein the base portion has a dissipation surface and a substantially opposed mounting surface, and at least one channel formed in the base portion thereof. In this embodiment, the at least one channel may allow air from a fan to flow through the base portion to the substrate carrier, providing airflow to one or more components formed thereon.

It is worthy to note that any reference in the specification to "one embodiment" or "an embodiment" means that a particular feature, structure, or characteristic described in connection with the embodiment is included in at least one embodiment of the claimed subject matter. The appearances of the phrase "in one embodiment" in various places in the specification are not necessarily all referring to the same embodiment.

Numerous specific details may be set forth herein to provide a thorough understanding of the embodiments of the claimed subject matter. It will be understood by those skilled in the art, however, that the embodiments of the claimed subject matter may be practiced without these specific details. In other instances, well-known methods, procedures and components have not been described in detail so as not to obscure the embodiments of the claimed subject matter. It can be appreciated that the specific structural and functional details disclosed herein may be representative and do not necessarily limit the scope of the claimed subject matter.

Figure 1:
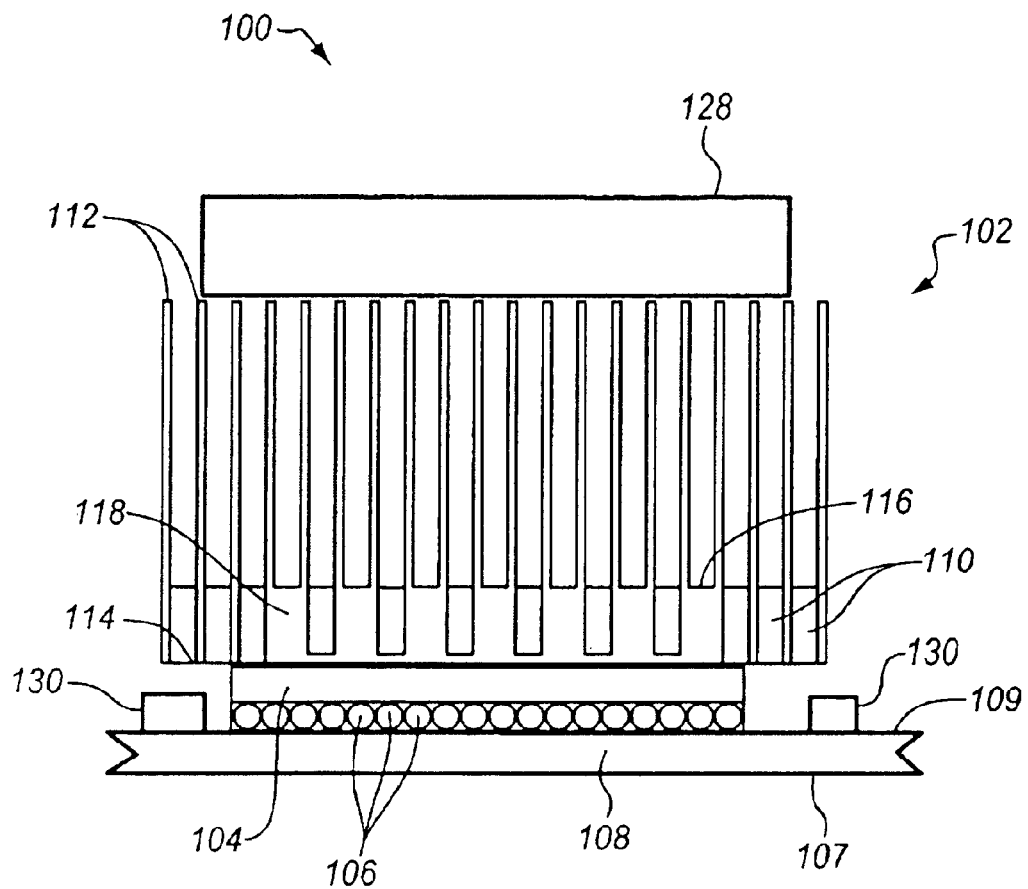
FIG. 1 is a side cross-sectional view of a first embodiment of a heat dissipation device attached to a microelectronic die, according to the present invention.

Referring now in detail to the drawings wherein like parts are designated by like reference numerals throughout, there is illustrated in FIG. 1 a microelectronic assembly 100 of the claimed subject matter comprising a heat dissipation device 102 attached to a microelectronic die 104 (illustrated as a flip chip). The microelectronic die has an active surface physically and electrically attached to the primary side 109 of a substrate carrier 108 by a plurality of solder balls 106, although, in alternative embodiments, the microelectronic die may be electrically attached by use of a socket (not shown). The base portion 118 of the heat dissipation device has a mounting surface 114, and a heat dissipation surface 116. The mounting surface 114 of the base portion 118 of the heat dissipation device 102 is attached to the back surface of the microelectronic die 104, preferably by a thermally conductive adhesive (not shown), as known in the art. Although the heat dissipation device is illustrated as being attached to a microelectronic die 104, the claimed subject matter is not so limited. The heat dissipation device 102 may be attached to any surface from which removal of heat is desired. Furthermore, the heat dissipation device 102 may be constructed from a thermally conductive material such as copper, aluminum, alloys thereof, and the like. Numerous methods for formation may be incorporated to fabricate a device such as heat dissipation device 102, including die casting, machining, or molding, but the claimed subject matter is not limited to any particular method of formation.

Figure 2:
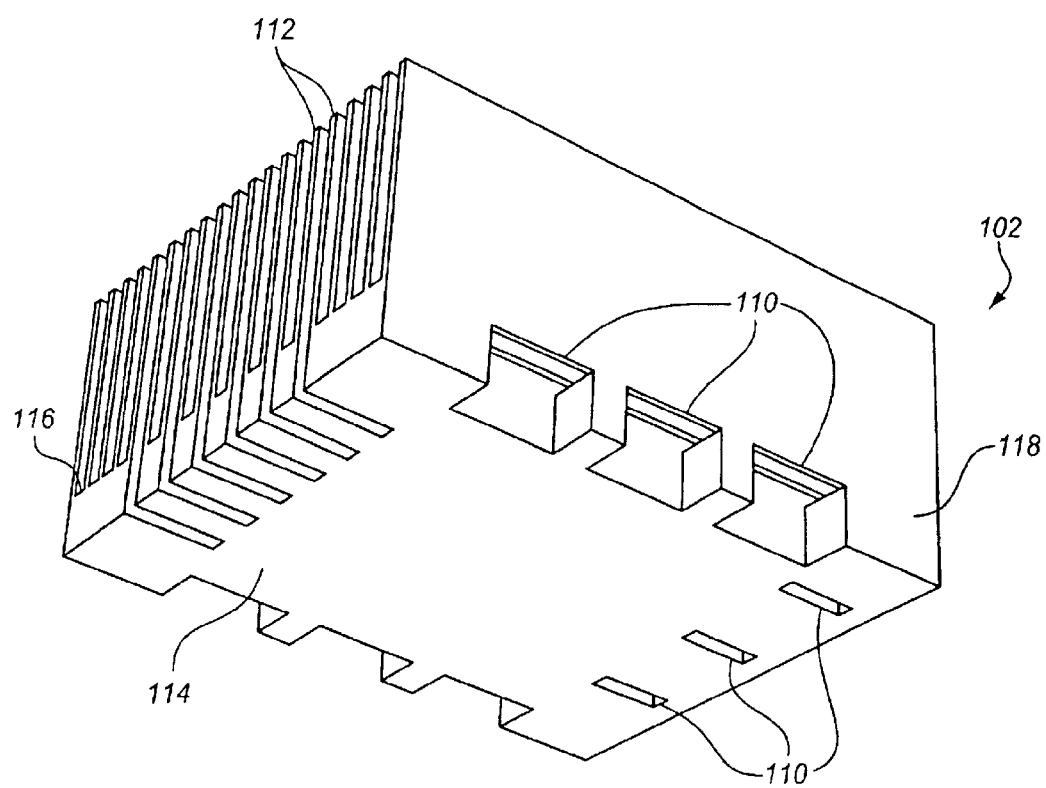
FIG. 2 is an oblique view of the cross-sectional view of the heat dissipation device, according to the present invention.

FIG. 2 shows an oblique view of a heat dissipation device 102, shown in a non-mounted configuration. As shown in FIGS. 1 and 2, the heat dissipation device comprises a base portion 118 with a mounting surface 114 and an opposing dissipation surface 116. A plurality of projections 112 may be formed on the heat dissipation device 102, and may extend substantially perpendicular from the base portion dissipation surface 116. The projections may include elongate planar fin-like structures or columnar/pillar structures, and may be formed during the formation of the heat dissipation device, for example. Heat dissipation device 102 may preferably be formed in a molding process, but numerous other methods or combinations of methods of formation may be used in accordance with at least one embodiment.

As shown in FIGS. 1 and 2, a plurality of channels 110 may extend from the dissipation surface 116 to an opposing mounting surface 114 of the base portion 118 of the device 102. At least one channel 110 may be substantially perpendicular to the base portion dissipation surface 116, although numerous configurations may be used in alternative embodiments. In this particular embodiment, a plurality of channels 110 are formed around the periphery of the base portion 118 of the device 102. The method of formation of these channels may vary, and any method or combination of methods of formation that results in at least one channel being formed in the base portion of a heat dissipation device is in accordance with the claimed subject matter. One method of formation may comprise a series of saw processes, where a sawing tool is applied to selected areas of the base portion 118 of the device 102, resulting in the formation of a plurality of channels 110. Additionally, one or more drill processes may be used to form one or more channels 110, or the channels may be formed in the initial molding process of the device 102, for example. It may be desirable, in the formation of one or more channels 110, to provide a portion of the mounting surface 114 free of one or more channels at least as large as the top surface of a microelectronic device 104, in order to ensure proper mounting to device 104, as shown in FIG. 1.

Referring now to FIG. 1, airflow from a fan 128 may travel parallel to the projections 112, into the one or more channels 110. At least a portion of the air may travel through and exit the one or more channels 110, and may travel across the top surface 109 of the substrate carrier 108. This may result in heat dissipation in one or more secondary components 130, which may include, for example, one or more voltage regulators, but the claimed subject matter is not so limited. Heat dissipation of these one or more secondary components may be by convective cooling, which may result from the airflow passing through the one or more channels 110.

It is important to note that the air channel configuration may vary in differing embodiments of the claimed subject matter. For example, the one or more air channels 110 are illustrated in FIGS. 1 and 2 as having a rectangular cross sectional shape. However, the air channels may have any appropriate shape, including but not limited to elliptical, triangular, or the like. Additionally, the air channels may take on any direction or configuration. The air channels in FIGS. 1 and 2 are shown as being perpendicular to surfaces 114 and 116 of device 102, but in alternative configurations, one or more air channels 110 may be formed to run diagonally from the surfaces 114 and 116, and may have multiple outlets, for example.

Figure 3:
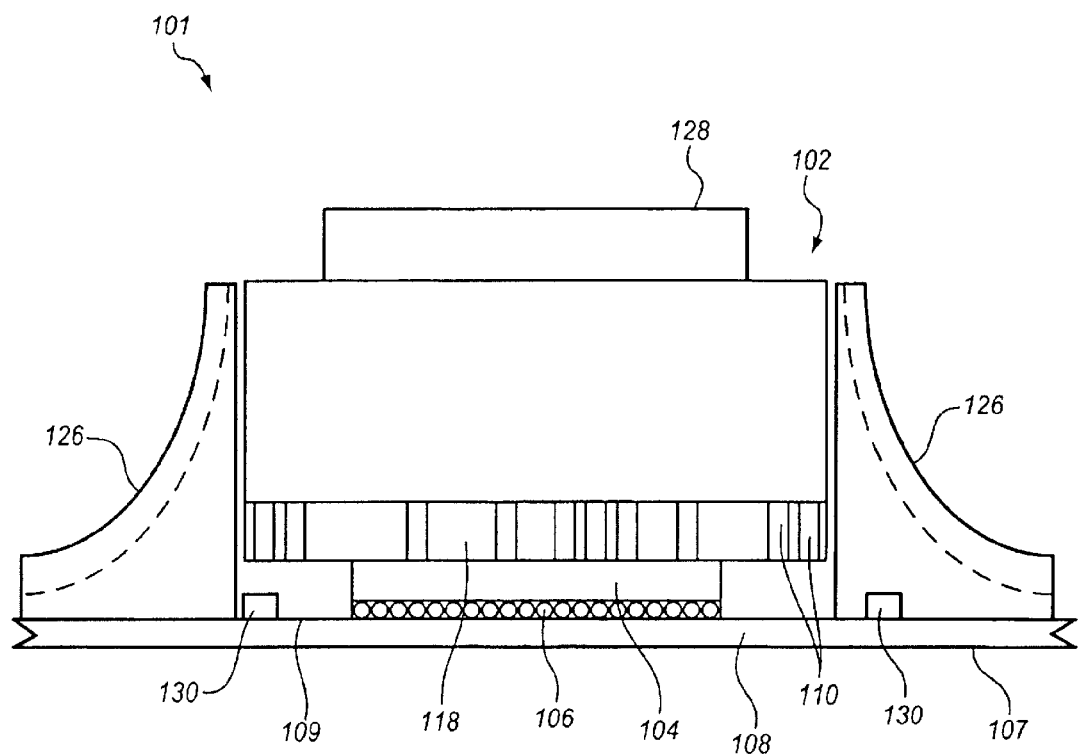
FIG. 3 is an alternate side cross-sectional view of a second embodiment of a heat dissipation device attached to a microelectronic die, according to the present invention.

In an alternative embodiment of the claimed subject matter, there is illustrated in FIG. 3 an alternate view of a microelectronic assembly 101 comprising a heat dissipation device 102 attached to a microelectronic die 104. The microelectronic die is physically and electrically attached to a substrate carrier 108 by a plurality of solder balls 106. A plurality of channels 110 may be formed on the device 102. One or more secondary components 130, which may include, for example, one or more voltage regulators, may be formed on substrate carrier 108. A shroud 126 may be formed proximate to the heat dissipation device 102, and may be attached to the top surface 109 of substrate carrier 108. Shroud 126 may be formed out of plastic by use of one or more injection molding processes, but the claimed subject matter is not limited to any particular material or formation process. Shroud 126 may enhance or alter airflow across the top surface 109 of the substrate carrier 108, by directing the airflow in a particular direction, for example. In operation, shroud 126 may direct air passing through channels 110, and cause air to flow over one or more secondary components 130 rather than dissipate, for example. It is important to note, however, that the claimed subject matter is not limited to use of a shroud, or is a shroud limited to a configuration illustrated in FIG. 2, but any configuration that results in enhanced airflow across a substrate may be in accordance with the claimed subject matter. The embodiment illustrated in FIG. 3 may be advantageous for use in a microelectronic assembly that incorporates one or more secondary components mounted on the secondary side of a substrate, where heat dissipation of these components may be desirable, for example.

Figure 4:
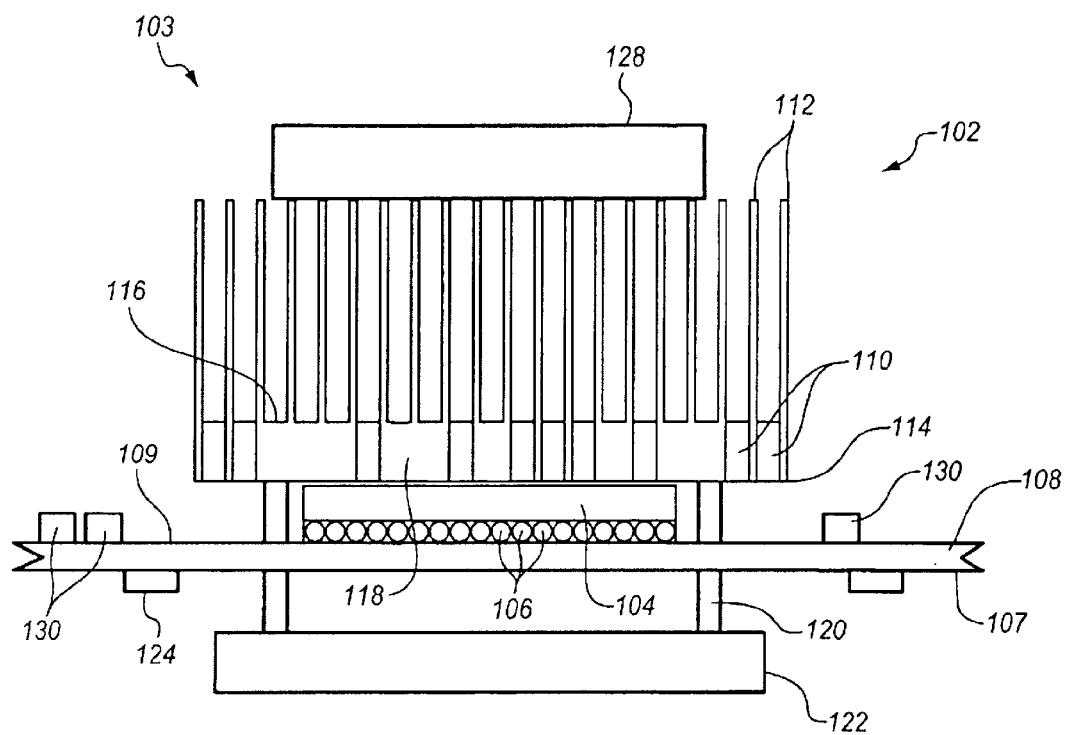
FIG. 4 is a side cross-sectional view of a third embodiment of a heat dissipation device attached to a microelectronic die, according to the present invention.

In another alternative embodiment of the claimed subject matter, there is illustrated in FIG. 4 a microelectronic assembly 103 comprising a heat dissipation device 102 attached to a microelectronic die 104. The microelectronic die is physically and electrically attached to a substrate carrier 108 by a plurality of solder balls 106. A mounting surface 114 of a base portion 118 of the heat dissipation device 102 is attached to one surface of the microelectronic die 104, preferably by a thermally conductive adhesive (not shown). A plurality of channels 110 may extend from the dissipation surface 116 to an opposing mounting surface 114 of the base portion 118 of the device 102. The plurality of channels 110 may be substantially perpendicular to the base portion dissipation surface 116 in one embodiment. In this particular embodiment, a fan 122 may be mounted to a plurality of support members 120. The support members 120 are shown as being mounted to device 102 by passing through substrate carrier 108, but alternative embodiments exist. For example, fan 122 may be mounted by use of one or more support members 120 to the secondary side 107 of the substrate carrier 108. In operation, tan 122 may provide airflow to the secondary surface 107 of the substrate carrier 108. A substantial portion of the air may be caused to flow parallel to the secondary surface 107, which may result in airflow being provided to one or more secondary components 124. This airflow may result in some amount of heat dissipation for the secondary components 124. The embodiment illustrated in FIG. 4 may be advantageous for use in a microelectronic assembly that incorporates one or more secondary components mounted on the secondary side of a substrate, where heat dissipation of these components may be desirable, for example.

Figure 5:
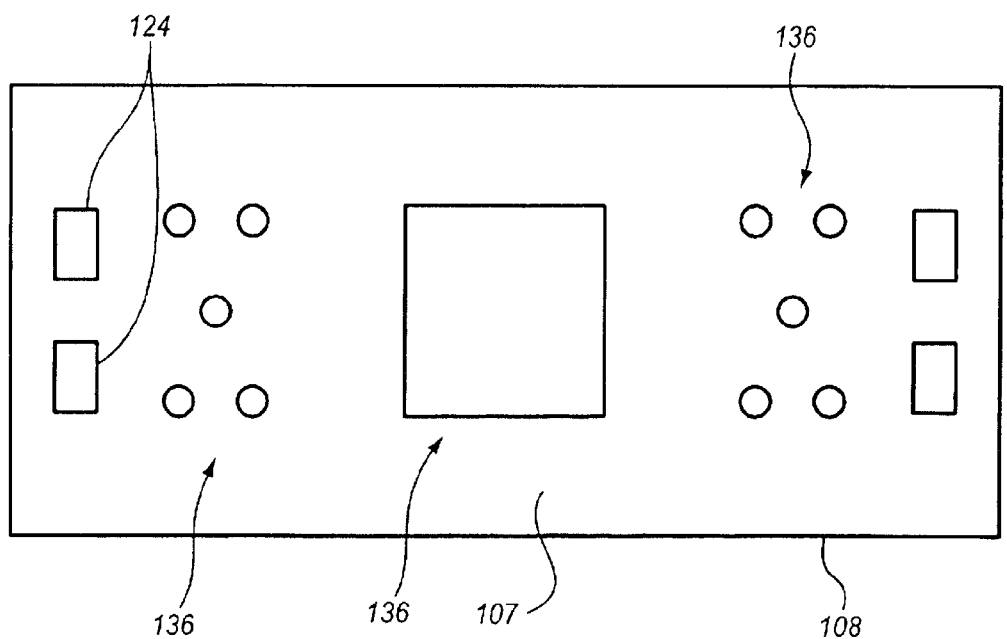
FIG. 5 is a bottom plan view of various components of a substrate that may be incorporated as part of the present invention.
Figure 6:
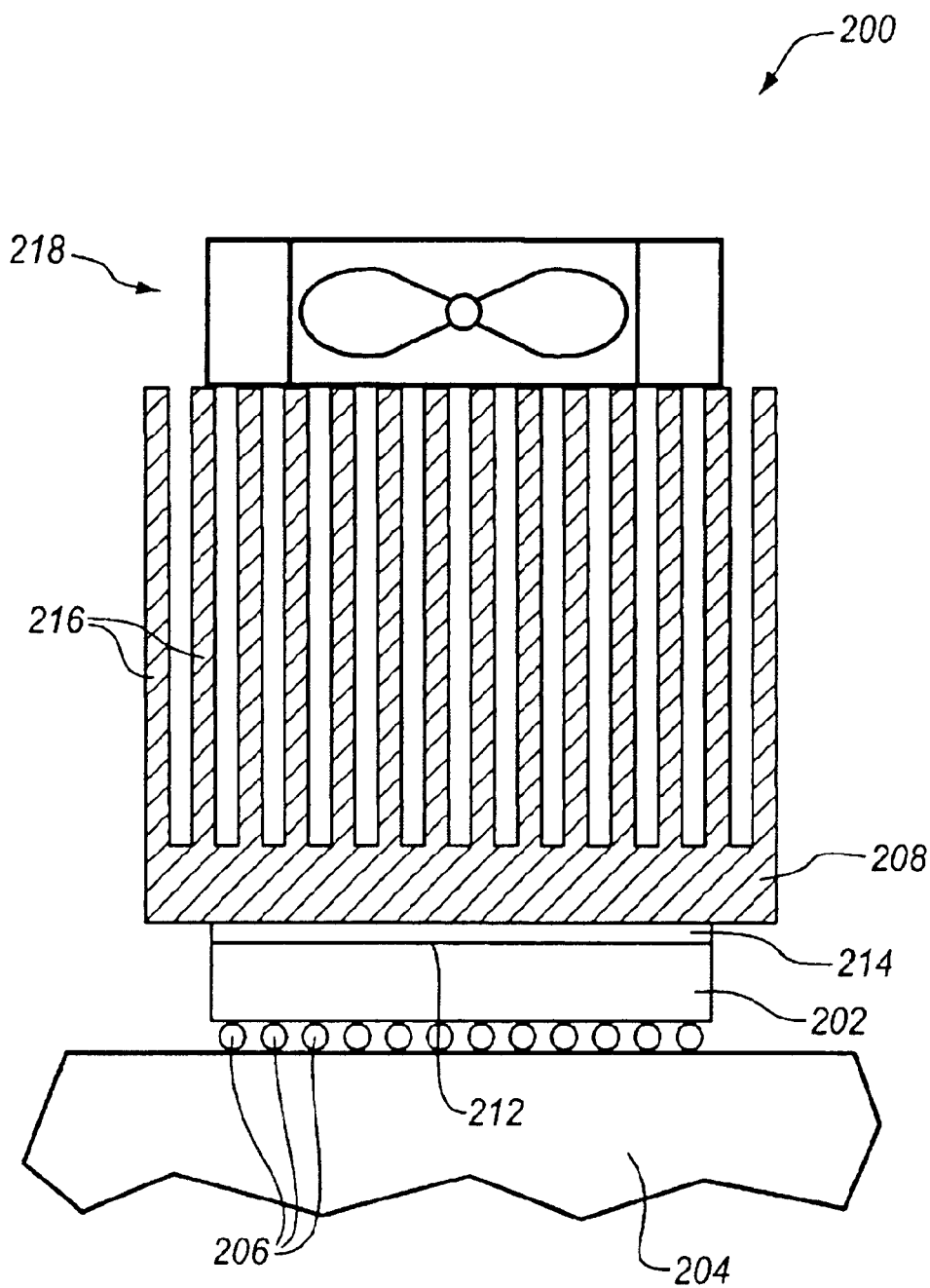
FIG. 6 is a side cross-sectional view of a heat dissipation device attached to a microelectronic die, as known in the art.

FIG. 5 illustrates a substrate secondary side modification that may be incorporated for use in one or more of the illustrated embodiments, such as the secondary side fan configuration of FIG. 4. Shown in FIG. 5 is a secondary side view of a substrate carrier 108. The substrate carrier secondary side 107 may have formed thereon a plurality of solder balls 136. The plurality of solder balls 136 may be formed on opposing sides of a microelectronic device footprint 138, for example. In operation, the secondary side solder balls may be utilized in the microelectronic assembly of FIG. 4, and may provide enhanced heat dissipation for one or more secondary side components 124. Enhanced heat dissipation may be provided in the following manner: airflow may be provided from a fan such as fan 122 of FIG. 4. At least a portion of the airflow may flow parallel to secondary surface 107, and may, when encountering the plurality of solder balls 136, undergo an increase in turbulence. This increase in turbulence may result in enhanced heat dissipation of one or more secondary side components 124 as compared to the heat dissipation provided by laminar airflow. Formation of the solder balls 136 may be performed in a variety of ways, including one or more wave solder processes. It is important to note, however, that the claimed subject matter is not limited to use of any particular formation method, but any method of fabrication that results in the formation of a plurality of solder balls on the secondary side of a substrate carrier is in accordance with the claimed subject matter.

It can be appreciated that the embodiments may be applied to the formation of any semiconductor device wherein heat dissipation may be desirable. Certain features of the embodiments of the claimed subject matter have been illustrated as described herein, however, many modifications, substitutions, changes and equivalents will now occur to those skilled in the art. Additionally, while several functional blocks and relations between them have been described in detail, it is contemplated by those of skill in the art that several of the operations may be performed without the use of the others, or additional functions or relationships between functions may be established and still be in accordance with the claimed subject matter. It is, therefore, to be understood that the appended claims are intended to cover all such modifications and changes as fall within the true spirit of the embodiments of the claimed subject matter.

What is claimed is:

1. A microelectronic assembly, comprising:
    a microelectronic die having a back surface and an active surface;
    a heat dissipation device coupled to the microelectronic die back surface, wherein said heat dissipation device comprises:
        a base portion having a dissipation surface and a substantially opposed mounting surface;
        at least one channel defined in the base portion, wherein said at least one channel extends from said dissipation surface to said mounting surface;
        a plurality of projections extending from said base portion dissipation surface; and
        a first fan mounted on at least a portion of said plurality of projections to provide airflow substantially towards said at least one channel;
    a substrate having a primary and a secondary side, wherein said substrate primary side is coupled to said microelectronic die active surface; and
    a second fan coupled to the secondary side of said substrate, said second fan positioned to provide airflow to at least a portion of said secondary side.

2. The microelectronic assembly of claim 1, additionally comprising a shroud formed between said fan and said base portion, said shroud formed proximate to said plurality of projections.

3. The microelectronic assembly of claim 2, wherein said shroud is positioned to enable airflow from said fan that passes through said at least one channel to be diverted away from said heat dissipation device.

4. The microelectronic assembly of claim 1, wherein said at least one channel is formed proximate to said one or more sides of said base portion.

5. The microelectronic assembly of claim 1, further comprising a plurality of solder balls formed on the secondary side of the substrate, wherein said plurality of solder balls are formed proximate to said second fan.

* * * * *